United States Patent
Hwang et al.

(10) Patent No.: US 9,482,472 B2
(45) Date of Patent: Nov. 1, 2016

(54) FINNED COOLING HEAT EXCHANGER MODULE WITH CONCAVE CIRCULAR VORTEX GENERATING AREA

(75) Inventors: Jer-Sheng Hwang, Taoyuan (TW); Teng-Kai Chang, Taoyuan (TW)

(73) Assignee: ENERMAX TECHNOLOGY CORPORATION, Taoyuan County (TW)

( * ) Notice: Subject to any disclaimer, the term of this patent is extended or adjusted under 35 U.S.C. 154(b) by 383 days.

(21) Appl. No.: 13/562,957

(22) Filed: Jul. 31, 2012

(65) Prior Publication Data
US 2013/0068424 A1    Mar. 21, 2013

(30) Foreign Application Priority Data

Sep. 21, 2011  (TW) .............................. 100217648 U

(51) Int. Cl.
| | | |
|---|---|---|
| F28D 15/00 | (2006.01) | |
| F28F 3/02 | (2006.01) | |
| F28F 3/12 | (2006.01) | |
| H01L 23/473 | (2006.01) | |

(52) U.S. Cl.
CPC .................. *F28D 15/00* (2013.01); *F28F 3/02* (2013.01); *F28F 3/12* (2013.01); *H01L 23/473* (2013.01); *H01L 2924/0002* (2013.01)

(58) Field of Classification Search
CPC ..................... H01L 23/473; H01L 2924/0002; H01L 2924/00; H05K 7/20254; H05K 7/20272; F28D 15/00; F28F 3/02; F28F 3/12
USPC ............................ 165/80.4, 109.1, 168, 170; 361/679.53–679.54, 699, 702, 704
See application file for complete search history.

(56) References Cited

U.S. PATENT DOCUMENTS

| | | | | |
|---|---|---|---|---|
| 5,019,880 | A * | 5/1991 | Higgins, III. ......... | H01L 23/467 165/80.3 |
| 5,592,363 | A * | 1/1997 | Atarashi ............... | H01L 23/467 165/185 |
| 5,662,163 | A * | 9/1997 | Mira .................... | H01L 23/4006 165/185 |
| 5,705,854 | A * | 1/1998 | Atarashi ............. | H01L 23/4336 257/721 |
| 5,709,263 | A * | 1/1998 | Mira ............................ | 165/80.3 |
| 5,940,269 | A * | 8/1999 | Ko et al. ........................ | 361/697 |
| 6,019,165 | A * | 2/2000 | Batchelder ................... | 165/80.3 |
| 6,161,610 | A * | 12/2000 | Azar ............................. | 165/80.3 |
| 6,253,835 | B1 * | 7/2001 | Chu et al. .................... | 165/80.4 |
| 6,289,975 | B2 * | 9/2001 | Kuo .............................. | 165/185 |

(Continued)

*Primary Examiner* — Len Tran
*Assistant Examiner* — Gordon Jones
(74) *Attorney, Agent, or Firm* — Chun-Ming Shih; HDLS IPR Services

(57) ABSTRACT

A liquid cooling heat exchanger module filled with a cooling liquid includes a casing (10) and a cooling structure (11), and the interior of the casing (10) is hollow, and the casing (10) has an inlet (100) and an outlet (101) interconnected to the interior, and the cooling structure (11) is installed in the casing (10), and the cooling structure (11) has a vortex generating area (110) concavely formed at a position opposite to the inlet (100), such that a cooling liquid is filled from the inlet (100) into the casing (10) and impacted in the vortex generating area (110) to form a vortex, so as to achieve the effects of extending the time for the cooling liquid to stay in the heat exchanger module (1), maximizing the cooling effect of the cooling liquid, and improving the heat dissipating efficiency.

8 Claims, 6 Drawing Sheets

(56) References Cited

U.S. PATENT DOCUMENTS

| | | | |
|---|---|---|---|
| 6,698,511 B2 * | 3/2004 | DiBene, II | H01L 23/3672 165/185 |
| 7,143,816 B1 * | 12/2006 | Ghosh | H01L 23/473 165/104.28 |
| 7,204,299 B2 * | 4/2007 | Bhatti et al. | 165/104.33 |
| 7,262,966 B2 * | 8/2007 | Liao | 361/699 |
| 7,303,002 B2 * | 12/2007 | Usui et al. | 165/109.1 |
| 7,331,380 B2 * | 2/2008 | Ghosh | H01L 23/473 165/104.33 |
| 8,528,627 B2 * | 9/2013 | Hsu et al. | 165/80.3 |
| 2004/0107718 A1 * | 6/2004 | Bowman et al. | 62/259.2 |
| 2006/0225867 A1 * | 10/2006 | Park et al. | 165/80.4 |
| 2007/0029070 A1 * | 2/2007 | Yamamoto et al. | 165/104.28 |
| 2007/0107874 A1 * | 5/2007 | Peng | 165/80.4 |
| 2009/0071625 A1 * | 3/2009 | Lyon | F28D 15/00 165/104.19 |
| 2009/0145581 A1 * | 6/2009 | Hoffman et al. | 165/80.3 |
| 2010/0315780 A1 * | 12/2010 | Murakami | H01L 23/473 361/699 |
| 2012/0018137 A1 * | 1/2012 | Chang | F28D 15/0233 165/185 |

* cited by examiner though the length of the flow channel and the time to keep the cooling liquid in the heat exchanger module. No matter how we increase the length of the flow channel, there is still a limitation of hardware dimensions, so that the conventional heat exchanger modules cannot overcome the aforementioned problems effectively. Obviously, a feasible solution is required.

In view of the foregoing problems, the inventor of the present invention conducted extensive researches and experiments, and finally provided a feasible design to overcome the problems.

SUMMARY OF THE INVENTION

Therefore, it is a primary objective of the present invention to provide an improved liquid cooling heat exchanger module capable of driving a cooling liquid to produce a vortex in the heat exchanger module, so as to achieve the effects of increasing the time for the cooling liquid to stay in the heat exchanger module, maximizing the cooling effect of the cooling liquid, and improving the heat dissipating efficiency.

To achieve the aforementioned objective, the present invention provides an improved liquid cooling heat exchanger module filled with a cooling liquid and comprising a casing and a cooling structure, wherein the interior of the casing is hollow, and the casing has an inlet and an outlet interconnected to the interior, and the cooling structure is installed in the casing, and the cooling structure has a vortex generating area concavely formed at a position opposite to the inlet, such that the cooling liquid can be filled into the casing from the inlet, and the cooling liquid is impacted in the vortex generating area to form a vortex.

To achieve the aforementioned objective, the present invention provides an improved liquid cooling heat exchanger module filled with a cooling liquid and comprising a casing and a cooling structure, wherein the interior of the casing is hollow, and the casing has an inlet and an outlet interconnected to the interior, and the cooling structure is installed in the casing and has a plurality of flow channels, and the cooling structure has a vortex generating area concavely formed at a position opposite to the inlet, such that the cooling liquid can be filled into the casing from the inlet, and after the cooling liquid is impacted in the vortex generating area to form a vortex, the cooling liquid flows into each of the flow channels.

DESCRIPTION OF THE PREFERRED EMBODIMENTS

The technical characteristics and contents of the present invention will become apparent with the following detailed description and related drawings. The drawings are provided for the purpose of illustrating the present invention only, but not intended for limiting the scope of the invention.

Figure 1:
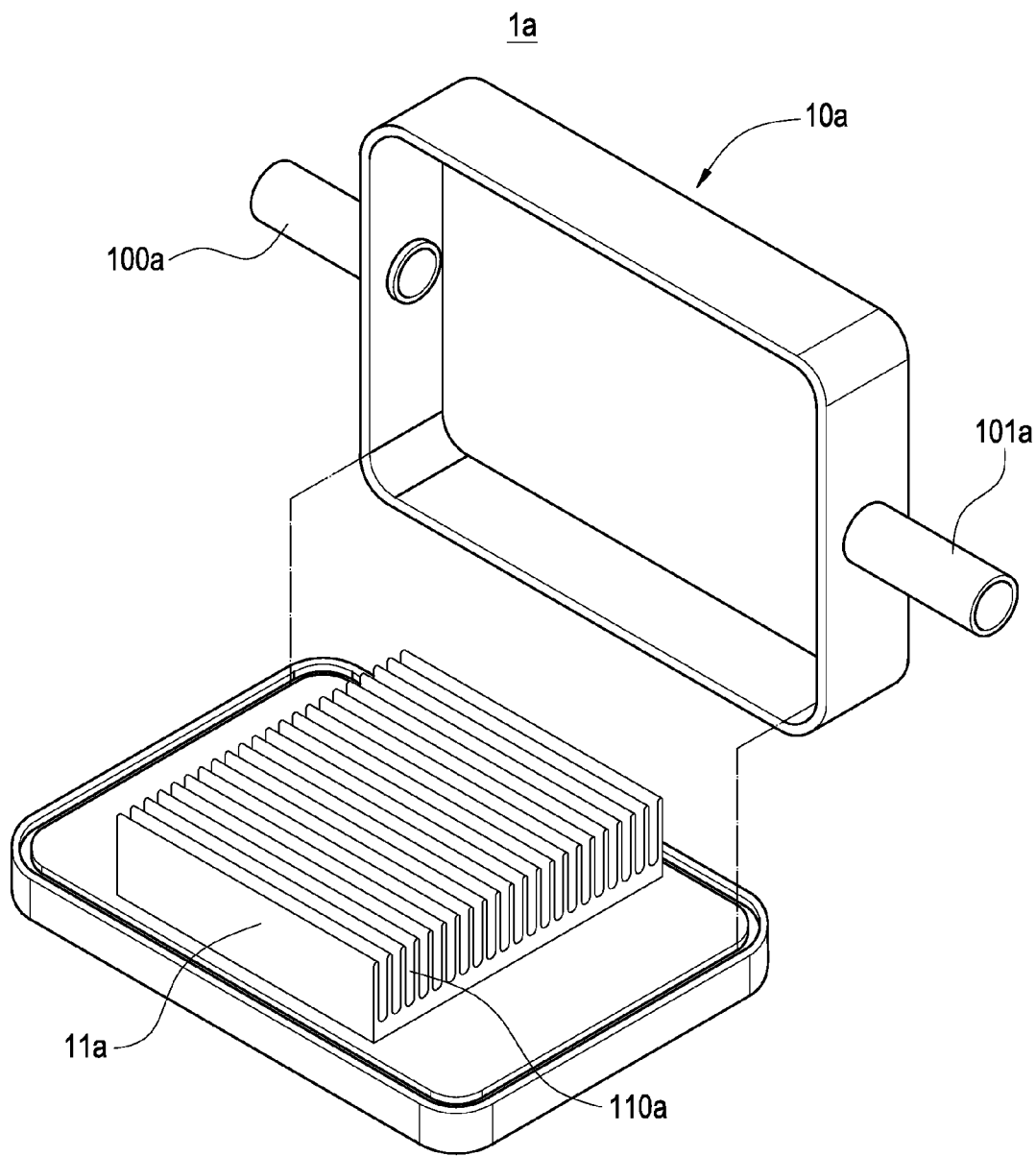
FIG. 1 is a schematic view showing the internal structure of a conventional heat exchanger module.
Figure 2:
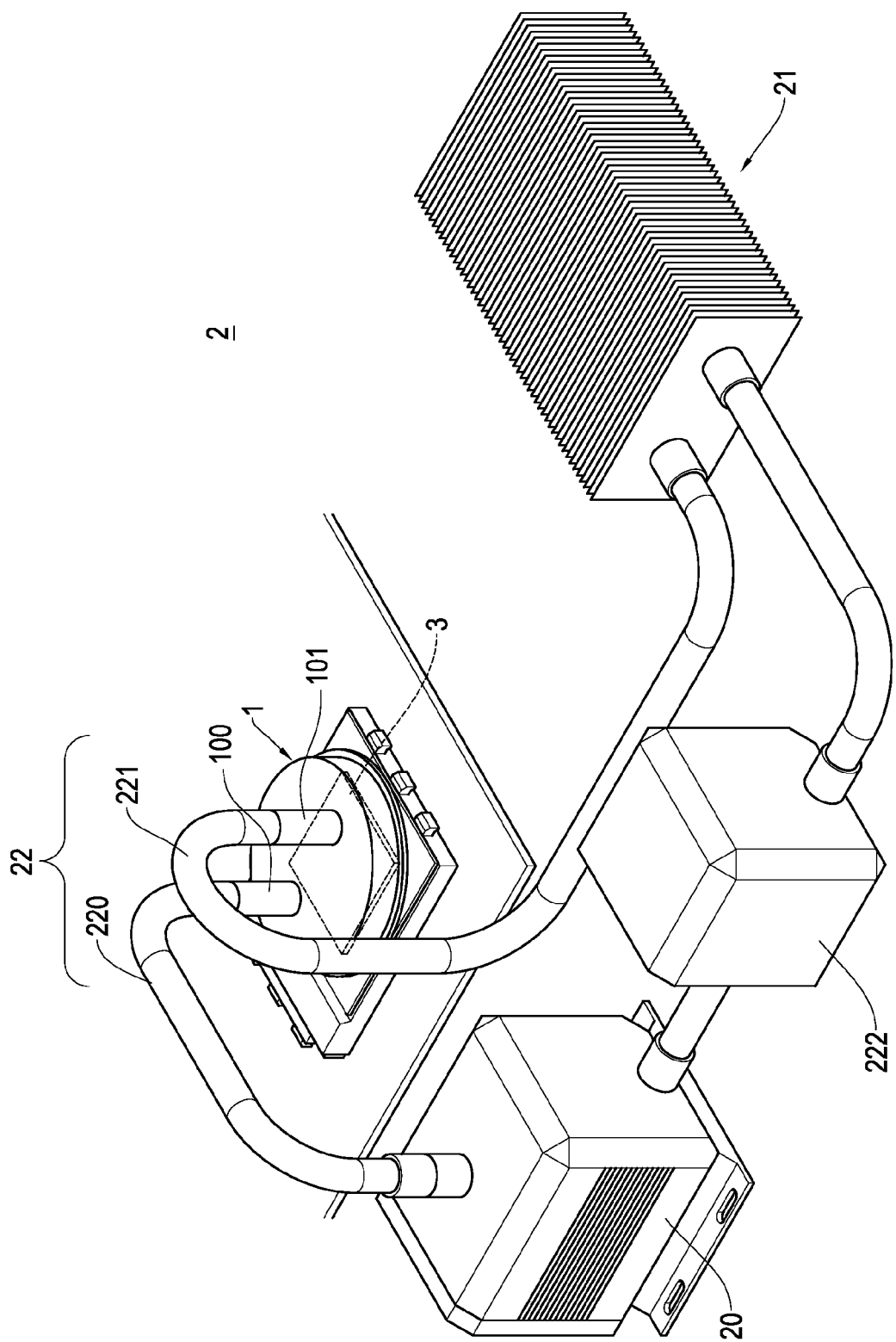
FIG. 2 is a schematic view of a liquid cooling heat dissipation system of the present invention.

With reference to FIG. 2 for a schematic view of a liquid cooling heat dissipation system of the present invention, the present invention provides an improved liquid cooling heat exchanger module 1 installed onto a liquid cooling heat dissipation system 2 for cooling a heat generating component 3 or providing a heat dissipating effect. The liquid cooling heat dissipation system 2 comprises a pump 20, a heat sink 21, a delivery loop 22 connected in series with each of the aforementioned components and comprised of an input pipe 220 and an output pipe 221, and a liquid cooling box 222 containing a cooling liquid (not shown in the figure), such that the pump 20 can pump the cooling liquid contained in the liquid cooling box 222 into the heat exchanger module 1 through the input pipe 220, and the heat exchanger module 1 can absorb heat generated by the heat generating component 3 through the cooling liquid to cool the heat generating component 3 or provide a heat dissipating effect, and the hot cooling liquid is transmitted from the output pipe 221 to the heat sink 21, and the heat sink 21 assists cooling the cooling liquid, and the cooled liquid is returned to the liquid cooling box 222 to allow the pump 20 to circulate and pump the cooled liquid into the heat exchanger module 1.

Figure 3:
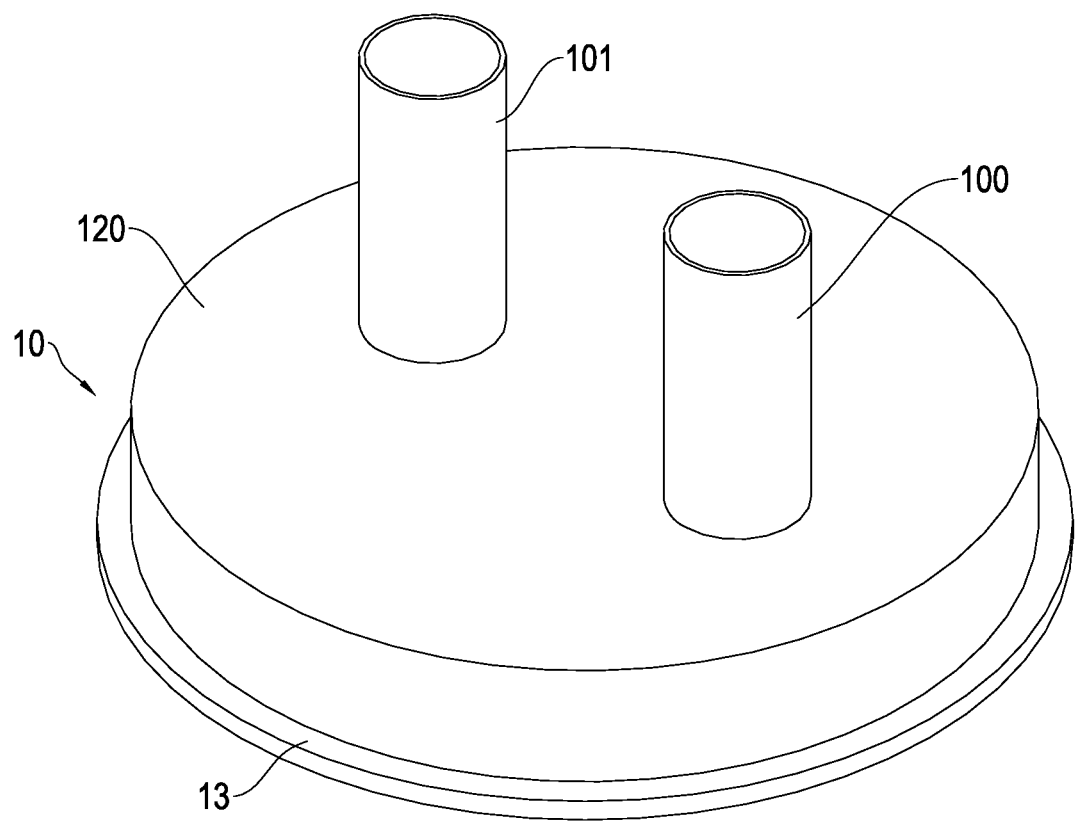
FIG. 3 is a perspective view of a first preferred embodiment of the present invention.
Figure 4:
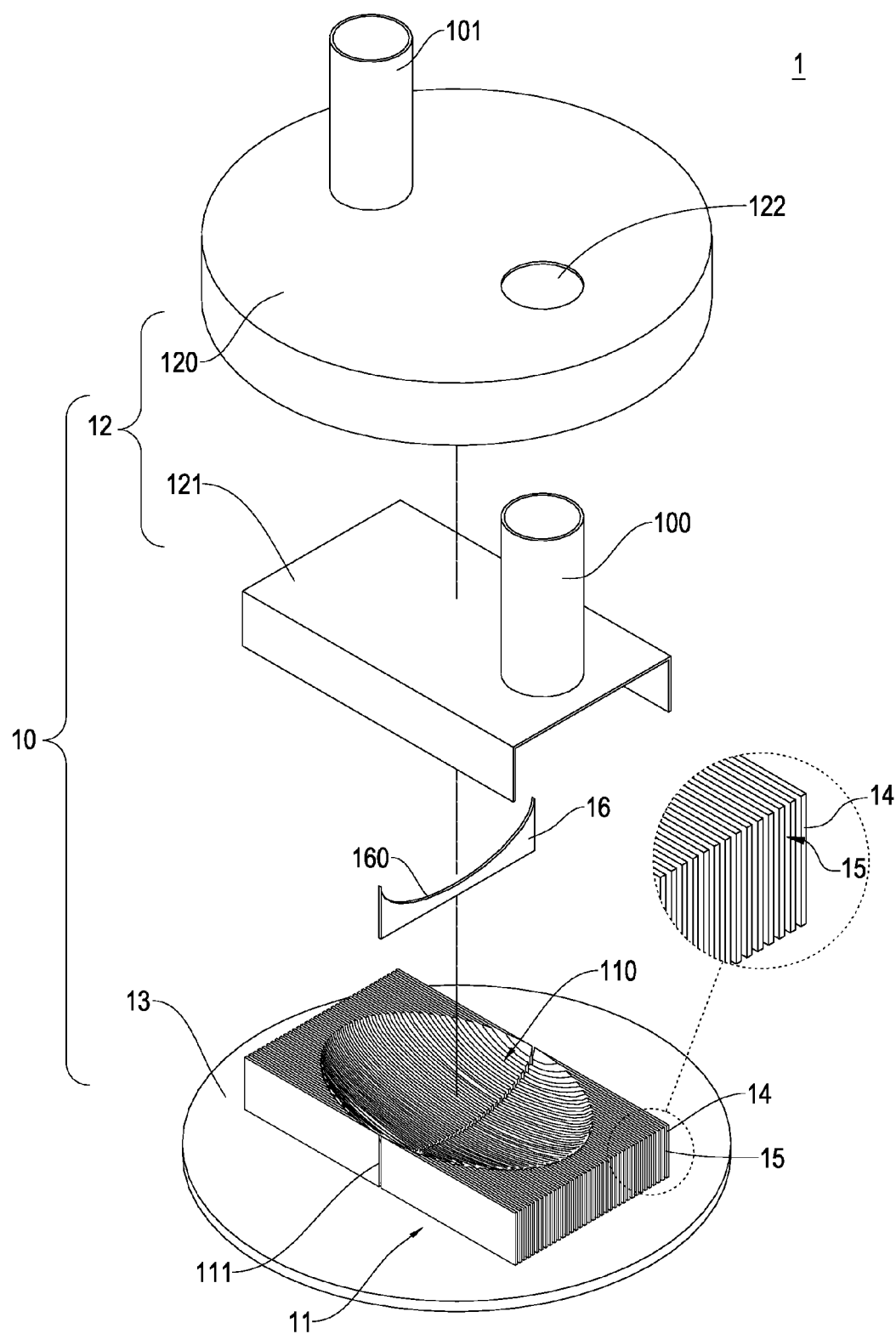
FIG. 4 is an exploded view of a first preferred embodiment of the present invention.

With reference to FIGS. 3 and 4, the heat exchanger module 1 comprises a hollow casing 10, and a cooling structure 11 installed in the casing 10, wherein the casing 10 has an inlet 100 and an outlet 101 formed thereon and interconnected to the interior of the casing 10 connecting to the input pipe 220 and the output pipe 221 respectively, so that a cooling liquid can be filled into the casing 10 from the inlet 100 and outputted from the outlet 101. In a preferred embodiment of the present invention, the inlet 100 and the outlet 101 are protruded in form of a connecting pipe, and the casing 10 comprises an upper casing 12 and a base 13, and the cooling structure 11 is installed on the base 13, and the upper casing 12 further comprises an external cover unit 120, and an internal partition unit 121 installed in the external cover unit 120, wherein the outlet 101 is formed on the external cover unit 120, and the inlet 100 is formed on the internal partition unit 121. Further, the external cover unit 120 has a through hole 122 formed thereon and at a position opposite to the inlet 100 for interconnecting to a connecting-pipe shaped inlet 100. In FIG. 4, a buffer area 123 formed on a lateral side of the internal partition unit 121 and a guiding area 124 formed at the top of the internal partition unit 121 are separated from each other and disposed between the external cover unit 120 and the internal partition unit 121, and the cooling structure 11 is further installed in the internal partition unit 121.

In summation, the present invention mainly designs a vortex generating area 110 concavely formed on the cooling structure 11 and at a position opposite to the inlet 100 of the casing 10, such that when the cooling liquid is filled into the casing 10, a cooling liquid is impacted directly in the vortex generating area 110 to form a vortex in the vortex generating area 110, so as to achieve the effect of extending the time for the cooling liquid to stay in the cooling structure 11, maximizing the cooling effect, and improving the heat dissipating efficiency. In a preferred embodiment of the present invention, the cooling structure 11 can be formed by erecting and separating a plurality of fins 14, and forming a flow channel 15 between two adjacent fins 14 for passing the cooling liquid, and the vortex generating area 110 is formed at the top of the fins 14, and the vortex generating area 110 is in a concave circular arc shape and preferably has an area that can cover the top of the fins 14 precisely.

In the first preferred embodiment of the present invention, the cooling structure 11 has a partition 16 installed between the flow channels 15 for dividing the flow channels 15 into left and right parts, such that when the cooling liquid in the vortex generating area 110 flows into each of the flow channels 15, the cooling liquid can flow out from both left and right sides of the cooling structure 11. In this preferred embodiment, the cooling structure 11 is formed by arranging the plurality of fins 14, so that a transversally cut groove 111 can be formed between two adjacent fins 14 and provided for embedding the partition 16 into the groove 111. In the meantime, the partition 16 has a concave arc edge 160 formed at the top of the partition 16 and in a shape corresponding to the concave shape of the vortex generating area 110.

With the aforementioned structural assembly, the improved liquid cooling heat exchanger module of the present invention is formed.

Figure 5:
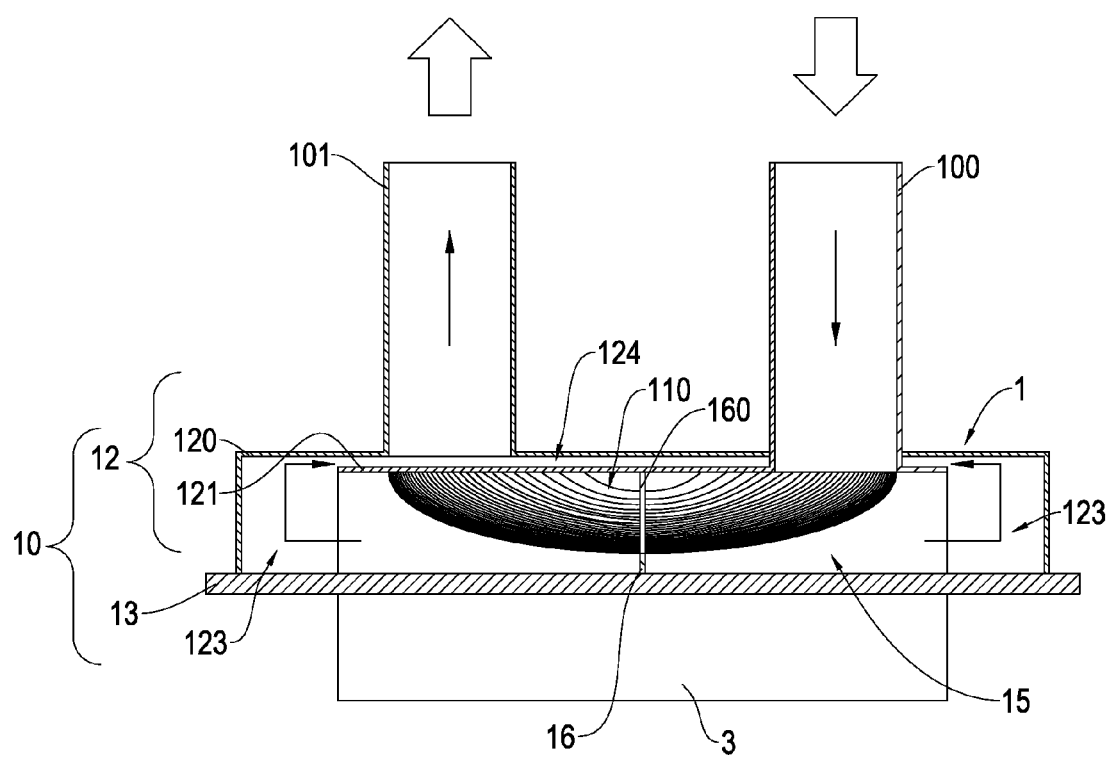
FIG. 5 is a schematic view showing the internal structure of a using status of the first preferred embodiment of the present invention.

With reference to FIGS. 2 and 5, when the pump 20 pumps the cooling liquid contained in the liquid cooling box 222 into the heat exchanger module 1 through the input pipe 220 and the inlet 100, the cooling liquid is impacted directly in the vortex generating area 110 and flows and turns along the concave shape of the vortex generating area 110 to form a vortex, so as to extend the time for the cooling liquid to stay in the cooling structure 11 (particularly at the top of each fin 14). As a result, there will be sufficient cooling time to absorb the heat generated by the heat generating component 3 (since the staying time is long enough to improve the heat exchange effect), so as to maximize the cooling effect of the cooling liquid and improve the heat dissipating efficiency of the heat generating component 3. The hot cooling liquid flows slowly into each flow channel 15 and is guided towards the buffer area 123 on both sides of the interior of the casing 10 by the flow channel 15 and further pushed to the top of the interior of the casing 10 and guided from the guiding area 124 to the outlet 101, and the hot cooling liquid is finally transmitted from the output pipe 221 to the heat sink 21 for the cooling purpose, and the cooled liquid is circulated again.

It is noteworthy to point out that the inlet 100 of the casing 1 can be formed on a side of the casing 1 and at a position opposite to the vortex generating area 110. In other words, the inlet 100 is not limited to the position precisely opposite to the center of the vortex generating area 110, but a position shifted towards a side can make it easier for the cooling liquid to be impacted in the vortex generating area 110 to form the vortex, and thus allowing the cooling liquid to stay for a longer time. Such effect is even better at a position proximate to the edge of the vortex generating area 110. When fluid flows in a pipe, pressure drops due to energy loss, and the energy loss of the fluid is generally caused by forces for overcoming the internal friction as well as the collisions and energy exchange between particles of the fluid in a vortex, and the pressure difference before and after the fluid flows is defined as the drip of pressure. The drop of pressure varies with factors such as the flowing speed of the fluid inside the pipe, the level of smoothness of the pipe used in an operation of an air conditioning system, and the way of connecting the pipe with shrinkage and or enclosure.

Figure 6:
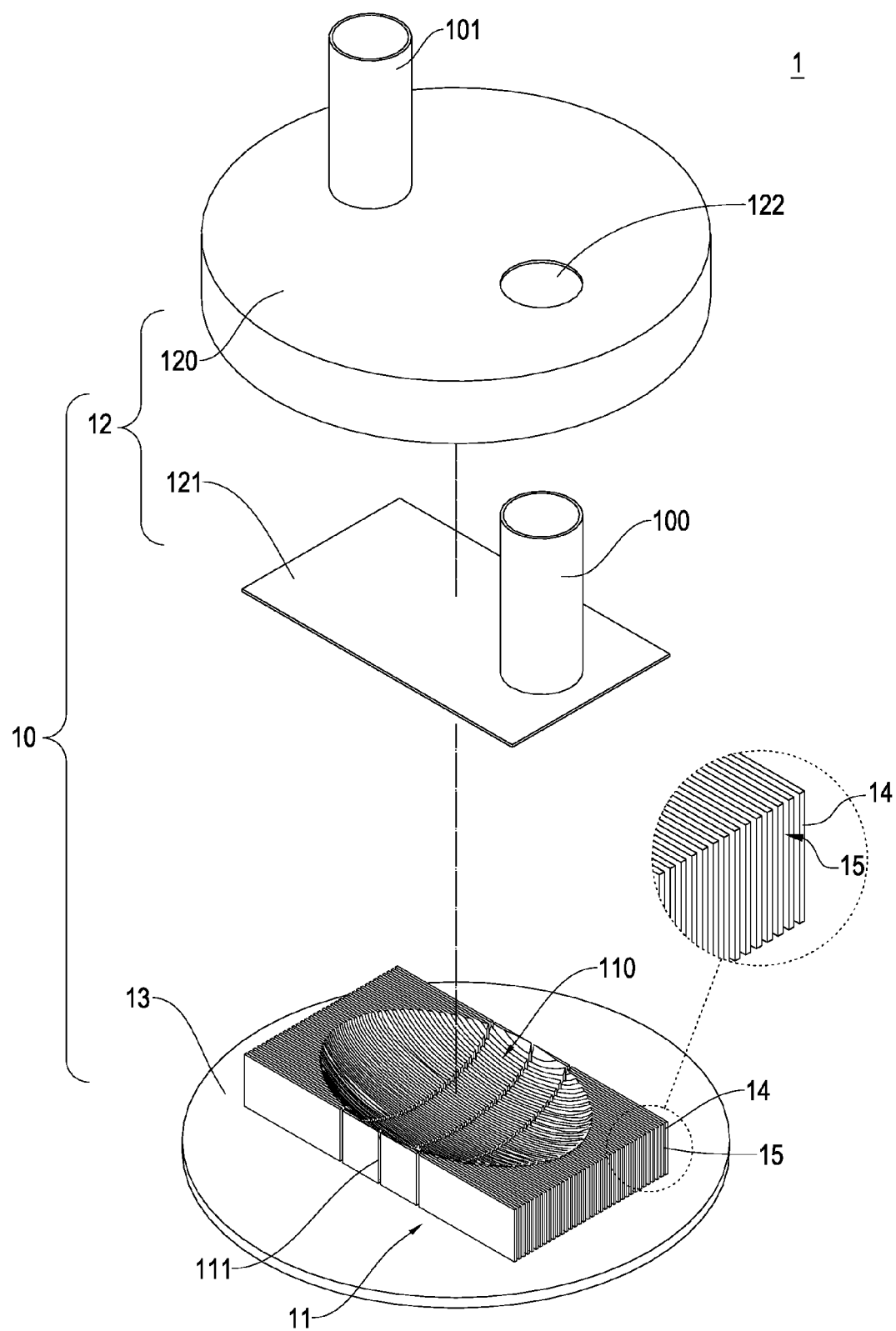
FIG. 6 is a perspective view of a second preferred embodiment of the present invention.

With reference to FIG. 6 for the second preferred embodiment of the present invention, the cooling structure 11 can have a transversally cut groove 111 formed between two adjacent fins 14, and the number of the grooves 111 can be increased according to the actual requirement. Through the groove 111, the flow channels 15 between the fins 14 can be connected with one another, so that the cooling liquid can flow from the groove 111 and out of the flow channels 15 between the fins 14 directly. The cooling liquid further flows towards the outlet 101 through the buffer area 123 and the guiding area 124.

In summation of the description above, the present invention overcomes the drawbacks of the prior art and complies with the patent application requirements, and thus is duly filed for patent application.

While the invention has been described by means of specific embodiments, numerous modifications and variations could be made thereto by those skilled in the art without departing from the scope and spirit of the invention set forth in the claims.

What is claimed is:

1. A liquid cooling heat exchanger module, filled with a cooling liquid, comprising:
   a casing (10) with a hollow interior, comprising an upper casing (12) and a base (13), the casing (10) having an inlet (100) and an outlet (101) formed on the casing (10) and interconnected to the interior of the casing (10); and a cooling structure (11), installed in the casing (10) and having a plurality of flow channels (15) formed by erecting a plurality of plate fins (14) arranged equidistantly from each other the plurality of plate fins having the same longitudinal length and are parallel to each other, wherein part of the plurality of plate fins (14) is concave toward the base (13) to form a vortex generating area (110) with a concave elliptical shape on the cooling structure (11), wherein a depth of the vortex generating area (110) radially decreases from a center of the vortex generating area (110) toward an upper edge of the plurality of plate fins (14) to form a bowl shape, wherein a top edge of each plate fin (14) which is concave toward the base (13) forms a curve line which extends the entire longitudinal length of the plate fin, and the length of the curve lines transversally decrease from a longitudinal center line to a longitudinal exterior line of the vortex generating area (110) the longitudinal lines of the vortex generating area being parallel to the curve lines, wherein the inlet (100) of the casing (10) is disposed at a position corresponding to a side in the vortex generating area (110);

thereby, the cooling liquid is filled from the inlet (100) into the casing (10), and after the cooling liquid is impacted in the vortex generating area (110) to form a vortex, the cooling liquid flows into each of the flow channels (15).

2. The liquid cooling heat exchanger module of claim 1, wherein the upper casing (12) comprises an external cover unit (120), and an internal partition unit (121) installed in the external cover unit (120), and the outlet (101) is formed on the external cover unit (120), and the inlet (100) is formed on the internal partition unit (121), and the cooling structure (11) is installed in the internal partition unit (121).

3. The liquid cooling heat exchanger module of claim 2, wherein the external cover unit (120) has a through hole (122) formed at a position corresponding to the inlet (100), and the inlet (100) is protruded in form of a connecting pipe, and the through hole (122) is provided for interconnecting the inlet (100).

4. The liquid cooling heat exchanger module of claim 2, further comprising a buffer area (123) disposed on a lateral side of the internal partition unit (121), and a guiding area (124) disposed at the top of the internal partition unit (121) and both areas (123), (124) being partitioned between the external cover unit (120) and the internal partition unit (121).

5. The liquid cooling heat exchanger module of claim 1, wherein the cooling structure (11) includes one or more transversely cut grooves (111) between the plurality of plate fins (14).

6. The liquid cooling heat exchanger module of claim 1, wherein the cooling structure (11) has a partition (16) installed between the flow channels (15) to separate the flow channels (15) from one another.

7. The liquid cooling heat exchanger module of claim 6, wherein the partition (16) has a concave arc edge (160) formed at the upper edge and corresponding to a concave shape of the vortex generating area (110).

8. The liquid cooling heat exchanger module of claim 4, wherein the internal partition unit (121) is directly disposed on the upper edge of the plurality of plate fins (14) so that the cooling liquid flows only in the vortex generating area (110), to the buffer area (123), then to the guiding area (124) and out from the outlet (101).

* * * * *